US 8,270,230 B2

(12) United States Patent
Yamaoka et al.

(10) Patent No.: US 8,270,230 B2
(45) Date of Patent: Sep. 18, 2012

(54) SEMICONDUCTOR DEVICE

(75) Inventors: Masanao Yamaoka, Kodaira (JP);
Kenichi Osada, Tokyo (JP)

(73) Assignee: Renesas Electronics Corporation,
Kawasaki-shi (JP)

( * ) Notice: Subject to any disclaimer, the term of this patent is extended or adjusted under 35 U.S.C. 154(b) by 0 days.

(21) Appl. No.: 13/353,949

(22) Filed: Jan. 19, 2012

(65) Prior Publication Data
US 2012/0120738 A1 May 17, 2012

Related U.S. Application Data

(62) Division of application No. 12/543,499, filed on Aug. 18, 2009, now Pat. No. 8,125,837.

(30) Foreign Application Priority Data

Sep. 1, 2008 (JP) ................. 2008-223290

(51) Int. Cl.
G11C 11/00 (2006.01)
G11C 7/10 (2006.01)
G11C 5/14 (2006.01)
(52) U.S. Cl. .............. 365/189.07; 365/154; 365/189.09
(58) Field of Classification Search ............. 365/189.07, 365/189.09, 154
See application file for complete search history.

(56) References Cited

U.S. PATENT DOCUMENTS

| 2005/0068824 A1 | 3/2005 | Houmura et al. |
| 2008/0181011 A1 | 7/2008 | Cho et al. |
| 2009/0027947 A1 | 1/2009 | Takeda |
| 2010/0202192 A1 | 8/2010 | Elvira Villagra et al. |

FOREIGN PATENT DOCUMENTS

JP 2007-035171 A 2/2007

*Primary Examiner* — VanThu Nguyen
*Assistant Examiner* — Khamdan Alrobaie
(74) *Attorney, Agent, or Firm* — Miles & Stockbridge P.C.

(57) ABSTRACT

The semiconductor device makes a comparison between a word-line timing signal for determining a word-line activation time and a reference signal, applies a back-gate bias for enlarging a read margin when the result of the comparison represents a low condition of the read margin, and applies a back-gate bias for enlarging a write margin when the comparison result represents a low condition of the write margin. The reference signal is selected depending on whether to compensate an operating margin fluctuating according to the word-line activation time (or word-line pulse width), or to compensate an operating margin fluctuating according to the process fluctuation (or variation in threshold voltage). By controlling the back-gate biases according to the word-line pulse width, an operating margin fluctuating according to the word-line pulse width, and an operating margin fluctuating owing to the variation in threshold voltage during its fabrication are improved.

4 Claims, 10 Drawing Sheets

|  |  | Read Margin | Write Margin |
|---|---|---|---|
| MOS Vth Control | nMOS | UP (Higher absolute value) | DOWN (Lower absolute value) |
|  | pMOS | DOWN (Lower absolute value) | UP (Higher absolute value) |
| Optimum Back-gate Bias | nMOS (VBN) | Reverse bias (-1.2V) | Forward bias (0.6V) |
|  | pMOS (VBP) | Forward bias (0.6V) | Reverse bias (2.4V) |

| Word-line Pulse Width | | Short | Long |
|---|---|---|---|
| Operating Margin | Read | Large | Small |
|  | Write | Small | Large |

Fig.9

| | | Word-line pulse width: Long | Word-line pulse width: Short |
|---|---|---|---|
| Pattern #1 | nMOS (VBN) | Reverse bias (-1.2V) | Forward bias (0.6V) |
| | pMOS (VBP) | Forward bias (0.6V) | Reverse bias (2.4V) |
| Pattern #2 | nMOS (VBN) | Reverse bias (-1.2V) | No bias (0V) |
| | pMOS (VBP) | No bias (1.2V) | Reverse bias (2.4V) |
| Pattern #3 | nMOS (VBN) | No bias (0V) | Forward bias (0.6V) |
| | pMOS (VBP) | Forward bias (0.6V) | No bias (1.2V) |
| Pattern #4 | nMOS (VBN) | Reverse bias (-1.2V) | Forward bias (0.6V) |
| | pMOS (VBP) | No bias (1.2V) | No bias (1.2V) |
| Pattern #5 | nMOS (VBN) | No bias (0V) | No bias (0V) |
| | pMOS (VBP) | Forward bias (0.6V) | Reverse bias (2.4V) |
| Pattern #6 | nMOS (VBN) | Reverse bias (-1.2V) | No bias (0V) |
| | pMOS (VBP) | No bias (1.2V) | No bias (1.2V) |
| Pattern #7 | nMOS (VBN) | No bias (0V) | No bias (0V) |
| | pMOS (VBP) | No bias (0V) | Reverse bias (2.4V) |
| Pattern #8 | nMOS (VBN) | No bias (0V) | Forward bias (0.6V) |
| | pMOS (VBP) | No bias (1.2V) | No bias (1.2V) |
| Pattern #9 | nMOS (VBN) | No bias (0V) | No bias (0V) |
| | pMOS (VBP) | Forward bias (0.6V) | No bias (1.2V) |

| Number of Memory cell rows | VBN | VBP |
|---|---|---|
| To 32 | Forward bias (0.6V) | Reverse bias (2.4V) |
| 33 to 128 | No bias | No bias |
| From 129 | Reverse bias (-1.2V) | Forward bias (0.6V) |

Fig.16

| nMOS Vth | | High (Higher absolute value) | Low (Lower absolute value) |
|---|---|---|---|
| Operating Margin | Read | Large | Small |
| | Write | Small | Large |

Fig.17

| | | WLT: Short (Vth: Small) | WLT: Long (Vth: Large) |
|---|---|---|---|
| Pattern #1 | nMOS (VBN) | Reverse bias (2.4V) | Forward bias (0.6V) |
| | pMOS (VBP) | Forward bias (0.6V) | Reverse bias (2.4V) |
| Pattern #2 | nMOS (VBN) | Reverse bias (2.4V) | No bias (0V) |
| | pMOS (VBP) | No bias (1.2V) | Reverse bias (2.4V) |
| Pattern #3 | nMOS (VBN) | No bias (0V) | Forward bias (0.6 V) |
| | pMOS (VBP) | Forward bias (0.6 V) | No bias (1.2V) |
| Pattern #4 | nMOS (VBN) | Reverse bias (2.4 V) | Forward bias (0.6 V) |
| | pMOS (VBP) | No bias (1.2V) | No bias (1.2V) |
| Pattern #5 | nMOS (VBN) | No bias (0V) | No bias (0V) |
| | pMOS (VBP) | Forward bias (0.6 V) | Reverse bias (2.4 V) |
| Pattern #6 | nMOS (VBN) | Reverse bias (2.4 V) | No bias (0V) |
| | pMOS (VBP) | No bias (1.2V) | No bias (1.2V) |
| Pattern #7 | nMOS (VBN) | No bias (0V) | No bias (0V) |
| | pMOS (VBP) | No bias (0V) | Reverse bias (2.4 V) |
| Pattern #8 | nMOS (VBN) | No bias (0V) | Forward bias (0.6 V) |
| | pMOS (VBP) | No bias (1.2V) | No bias (1.2V) |
| Pattern #9 | nMOS (VBN) | No bias (0V) | No bias (0V) |
| | pMOS (VBP) | Forward bias (0.6V) | No bias (1.2V) |

SEMICONDUCTOR DEVICE

CROSS REFERENCE TO RELATED APPLICATIONS

This application is a division of application Ser. No 12/543,499 filed Aug. 18, 2009 now U.S. Pat. No. 8,125,837. The Present application also claims priority from Japanese application JP 2008-223290 filed on Sep. 1, 2008, the content of which is hereby incorporated by reference into this application.

FIELD OF THE INVENTION

The invention relates to a semiconductor integrated circuit with a static random access memory (SRAM) integrated into its semiconductor chip. Particularly, it relates to a structure which enlarges an operating margin required for the operation of SRAM.

BACKGROUND OF THE INVENTION

In recent years, for semiconductor devices, e.g. SRAM, it has been strongly demanded to increase in processing speed, and lower in power consumption. To cut down the power consumption of SRAM, it is the simplest and most efficient means to reduce the source voltage. However, a lower source voltage so arranged shrinks an operating margin necessary for a transistor operation, thereby leading to an unstable working. Japanese Unexamined Patent Application Publication JP-A-2007-035171 discloses a technique for measuring an operating margin of SRAM while changing the word-line pulse width.

SUMMARY OF THE INVENTION

The progress of the manufacturing process of LSIs (Large Scale Integrated circuits) has pursued further miniaturization of transistors in LSI. In 2006, for instance, transistors as fine as fifty nanometers in gate length had been in mass production. With the progress of downsizing of transistors, the transistors exhibit a wider range of variation particularly in threshold voltage (Vth). The widening of the variation in the threshold voltage (Vth) of transistors lowers an operating margin of SRAM used as an on-chip memory of LSI, resulting in the difficulty of operating an SRAM memory cell. Operating margins of SRAM consist of a read margin, i.e. a margin at time of a read action, and a write margin, i.e. a margin at time of a write action. For normal operation, SRAM needs to have read and write margins over a certain level. Now, the read margin is herein regarded as the difficulty of inversing stored information during a read action, and the write margin is considered as the certainty of inversed writing during a write action. In this case, each operating margin tends to vary in concert with a word-line activation time during which the word line for controlling a memory cell of SRAM is in "H", i.e. the word-line pulse width, which has been already known. The longer the word-line pulse width is, the longer the time during which an amplifier continues to drive a memory cell over a corresponding bit line is, and therefore the write margin is made better (or larger) accordingly. On the other hand, the longer the word-line pulse width is, the longer the discharge operation time taken to draw a precharged electricity on one bit line through a storage node on a low-level side is, namely, the more often an undesired inversion is caused in stored information, and accordingly the read margin worsens (becomes smaller), insofar as a memory cell is concerned. Further, the fluctuation of the threshold voltage of a MOS transistor also has an influence on the operating margins. The fluctuation in the threshold voltage comes from a process fluctuation, a temperature change in operation, a fluctuation of the source voltage and other factors.

In an example of the JP-A-2007-035171, the operating margins are measured positively changing the word-line pulse width. Thus, it becomes possible to make measurements of the operating margins, which are hard to carry out in a usual functional test, and therefore it becomes possible to check whether a chip after fabrication works or not. However, the circuit cannot make better the SRAM operating margins per se, and has the difficulty in improving SRAM operating margins, which becomes a problem with the progress of the miniaturization and the like.

Therefore, it is an object of the invention to provide a semiconductor device which can automatically compensate the decline of write and read margins of a memory cell.

Further, it is another object of the invention to provide a semiconductor device which can detect and improve the decline of write and read margins of a memory cell.

The above and other objects of the invention and novel features thereof will become apparent from the description hereof and the accompanying drawings.

The preferred embodiments of the invention hereby disclosed will be outlined below briefly.

A semiconductor device according to the invention compares a word-line timing signal for deciding a word-line activation time with a reference signal. Then, the semiconductor device applies a back-gate bias for enlarging the read margin in case that a result of the comparison represents a low state of the read margin. In contrast, in case that the result of the comparison represents a low state of the write margin, the semiconductor device applies a back-gate bias for enlarging the write margin. The reference signal is changed depending on whether to compensate an operating margin which fluctuates according to a word-line activation time (i.e. a word-line pulse width), or compensate an operating margin which fluctuates according to the process fluctuation (i.e. the variation in threshold voltage). Therefore, controlling the back-gate bias by use of the word-line pulse width, the operating margin which fluctuates according to the word-line pulse width can be improved. Also, it is possible to improve the operating margin which fluctuates owing to the variation in threshold voltage during fabrication.

Now, the effects achieved by the preferred embodiments of the invention hereby disclosed will be described below briefly.

The first is that the decline of write and read margins of a memory cell can be compensated automatically. The second is that the decline of write and read margins of a memory cell can be detected and improved.

BRIEF DESCRIPTION OF THE DRAWINGS

FIG. 2 is a circuit diagram showing an example of the circuit configuration of SRAM cells of the SRAM section;

FIG. 3 is a table showing examples of control of the MOS transistor threshold voltages for enlargement of read and write margins of static type memory cells MC of SRAM section, and a pattern of application of back-gate biases necessary for that;

FIG. 4 is a table for explaining the relation between a word-line activation time (word-line pulse width) depending on a select signal on a word line and SRAM operating margin, showing examples of such relations;

FIG. 9 is a table showing examples of various control patterns for back-gate-bias control;

FIG. 16 is a table showing fluctuation patterns of operating margins of SRAM in a case that the threshold voltage Vth of an nMOS transistor fluctuates;

FIG. 17 is a table showing examples of various control patterns for back-gate-bias voltage control in a case that the threshold voltage Vth of an nMOS transistor fluctuates as shown in FIG. 16.

DETAILED DESCRIPTION OF THE PREFERRED EMBODIMENTS

1. Summary of the preferred embodiments

Figure 1:
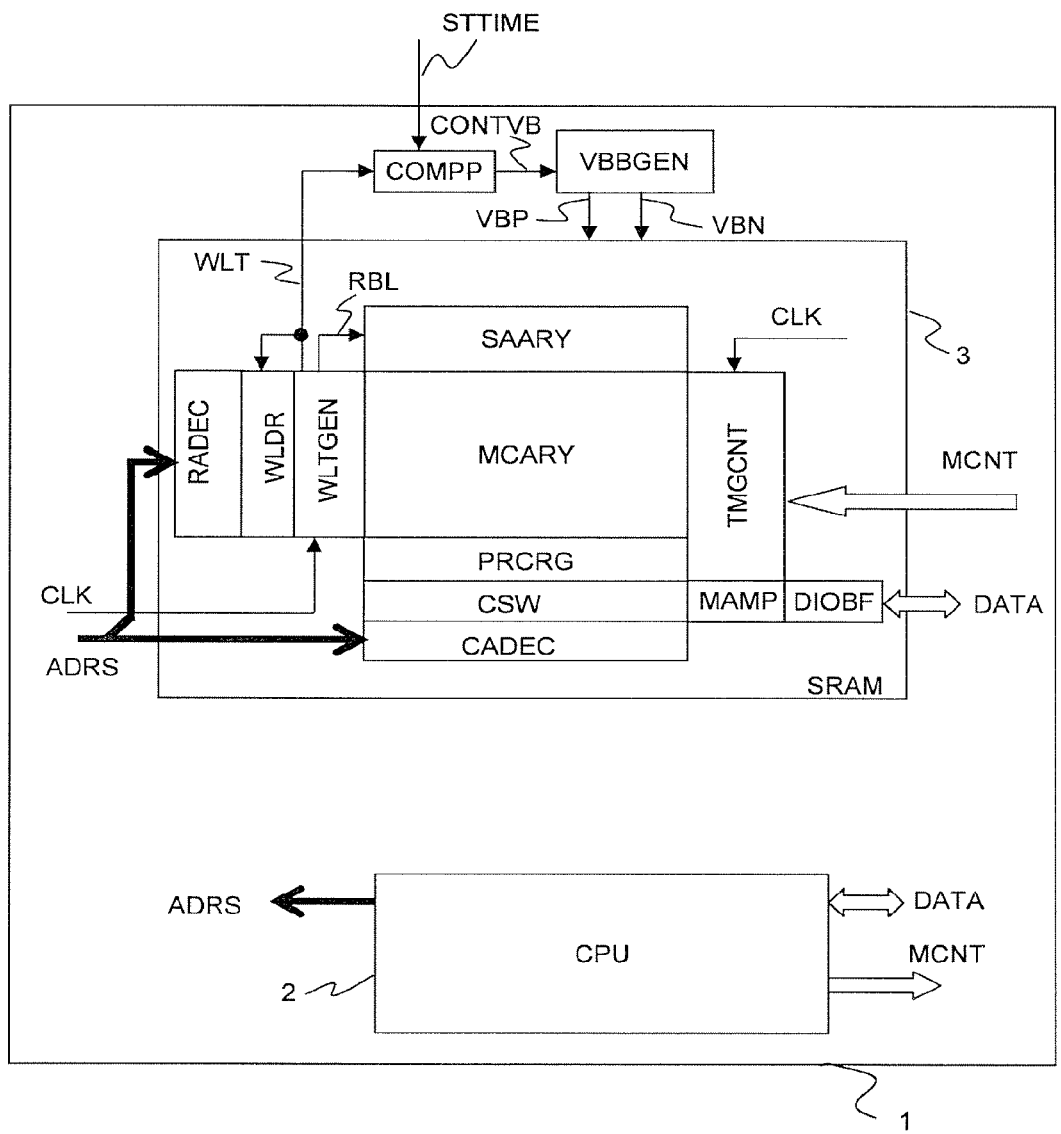
FIG. 1 is a block diagram showing an example of a semiconductor device according to the invention.

The preferred embodiments of the invention herein disclosed will be outlined first. Here, the reference numerals, characters or signs to refer to the drawings, which are accompanied with paired round brackets, only exemplify what the concepts of components referred to by the numerals, characters or signs contain.

[1] A semiconductor device (1) according to an embodiment of the invention from an aspect thereof has: an array (MCARY) of memory cells (MC) each having a select terminal connected with a word line and a data terminal connected with a bit line; a word-line-timing generator (WLTGEN) operable to generate a word-line timing signal (WLT) for deciding a word-line activation time; a comparator (COMPP) operable to make a comparison between the word-line timing signal and a reference signal (STTIME); and a back-gate-bias control circuit which applies a back-gate bias for enlarging a read margin when a result of the comparison by the comparator mirrors that the read margin is in a low condition, and in contrast, which applies a back-gate bias for enlarging a write margin when the comparison result mirrors that the write margin is in a low condition.

[2] In the semiconductor device (1) described in [1], the memory cells are each a static type memory cell having a pair of CMOS inverters with an input of one inverter and an output of the other connected with each other. In regard to a static type memory cell, as the word-line activation time (or word-line pulse width) is made longer, the time during which an amplifier continues to drive a memory cell over a corresponding bit line becomes longer, and accordingly the write margin is made better (or larger). That is, the shorter the word-line activation time is, the worse (or smaller) the write margin becomes. On the other hand, insofar as a memory cell is concerned, the longer the word-line pulse width is, the longer the discharge operation time taken to draw a precharged electricity on one bit line through a storage node on a low-level side is. Consequently, an electric floating is prone to occur at a data storage node, and an undesired inversion is more often caused in stored information. Accordingly, the read margin becomes worse. In reverse, the smaller the word-line pulse width is, the read margin is made better.

[3] In the semiconductor device (1) described in [2], the word-line-timing generator (WLTGEN) has a replica cell (RMC) equivalent to each memory cell in electrical characteristic during a read action, and changes the word-line timing signal (WLT) at time when a low level output of the replica cell selected in response to selecting a word line (WL) is settled. Thus, it becomes possible to incorporate a process variation during manufacture of the device and an actual circuit characteristic in the word-line timing signal (WLT) to be compared with the reference signal (STTIME) with ease.

[4] In the semiconductor device (1) described in [3], the further the word-line-timing generator (WLTGEN) delays the time of changing the word-line timing signal, the larger the number of word lines (WL) of the memory cell array (MCARY) is. Thus, it becomes possible to incorporate the configuration of the memory array, particularly a bit-line load's condition in the word-line timing signal (WLT) to be compared with the reference signal (STTIME) with ease.

[5] <<Embodiment focusing on the word-line pulse width and operating margins>>

When compensating an operating margin fluctuating according to the word-line activation time (word-line pulse width), a word-line timing signal is compared with a reference signal in terms of that. In the semiconductor device (1) described in [3], the back-gate-bias control circuit applies a reverse back-gate bias to a p-channel MOS transistor in a case that a period between a selection of a word line and a change of the word-line timing signal is shorter than the reference signal. Thus, the write margin is improved.

[6] <<Embodiment focusing on the word-line pulse width and operating margins>>

When compensating an operating margin fluctuating according to the word-line activation time (word-line pulse width), a word-line timing signal is compared with a reference signal in terms of that. In the semiconductor device (1) described in [3], the back-gate-bias control circuit applies a forward back-gate bias to an n-channel MOS transistor in a case that a period between a selection of a word line and a change of the word-line timing signal is shorter than the reference signal. Thus, the write margin is improved.

[7] <<Embodiment focusing on the word-line pulse width and operating margins>>

When compensating an operating margin fluctuating according to the word-line activation time (word-line pulse width), a word-line timing signal is compared with a reference signal in terms of that. In the semiconductor device (1) described in [3], the back-gate-bias control circuit applies a reverse back-gate bias to an n-channel MOS transistor in a case that a period between a selection of a word line and a change of the word-line timing signal is longer than the reference signal. Thus, the read margin is improved.

[8] <<Embodiment focusing on the word-line pulse width and operating margins>>

When compensating an operating margin fluctuating according to the word-line activation time (word-line pulse width), a word-line timing signal is compared with a reference signal in terms of that. In the semiconductor device (1) described in [3], the back-gate-bias control circuit applies a forward back-gate bias to a p-channel MOS transistor in a case that a period between a selection of a word line and a change of the word-line timing signal is longer than the reference signal. Thus, the read margin is improved.

[9] <<Embodiment focusing on the threshold voltage Vth of nMOS and operating margins>>

When compensating an operating margin fluctuating according to the process fluctuation (or the variation in threshold voltage of a MOS transistor), a word-line timing signal is compared with a reference signal in terms of that. In the semiconductor device (1) described in [3], the back-gate-bias control circuit applies a forward back-gate bias to a p-channel MOS transistor in a case that a period between a selection of a word line and a change of the word-line timing signal is shorter than the reference signal (i.e. a case that the read margin declines owing to the threshold voltage of an n-channel MOS transistor having a small absolute value, and the change of the word-line-select signal is speeded up). Thus, the read margin is improved.

[10] <<Embodiment focusing on the threshold voltage Vth of nMOS and operating margins>>

When compensating an operating margin fluctuating according to the process fluctuation (or the variation in threshold voltage of a MOS transistor), a word-line timing signal is compared with a reference signal in terms of that. In the semiconductor device (1) described in [3], the back-gate-bias control circuit applies a reverse back-gate bias to an n-channel MOS transistor in a case that a period between a selection of a word line and a change of the word-line timing signal is shorter than the reference signal (i.e. a case that the read margin declines owing to the threshold voltage of an n-channel MOS transistor having a small absolute value, and the change of the word-line-select signal is speeded up). Thus, the read margin is improved.

[11] <<Embodiment focusing on the threshold voltage Vth of nMOS and operating margins>>

When compensating an operating margin fluctuating according to the process fluctuation (or the variation in threshold voltage of a MOS transistor), a word-line timing signal is compared with a reference signal in terms of that. In the semiconductor device (1) described in [3], the back-gate-bias control circuit applies a forward back-gate bias to an n-channel MOS transistor in a case that a period between a selection of a word line and a change of the word-line timing signal is longer than the reference signal (i.e. a case that the write margin declines owing to the threshold voltage of an n-channel MOS transistor having a large absolute value, and the change of the word-line-select signal is slowed down). Thus, the write margin is improved.

[12] <<Embodiment focusing on the threshold voltage Vth of nMOS and operating margins>>

When compensating an operating margin fluctuating according to the process fluctuation (or the variation in threshold voltage of a MOS transistor), a word-line timing signal is compared with a reference signal in terms of that. In the semiconductor device (1) described in [3], the back-gate-bias control circuit applies a reverse back-gate bias to a p-channel MOS transistor in a case that a period between a selection of a word line and a change of the word-line timing signal is longer than the reference signal (i.e. a case that the write margin declines owing to the threshold voltage of an n-channel MOS transistor having a large absolute value, and the change of the word-line-select signal is slowed down). Thus, the write margin is improved.

[13] A semiconductor device (1B) according to an embodiment of the invention from another aspect thereof has a first memory section (SRAM 3c), and a second memory section (SRAM 3d), and the first and second memory sections are each provided with a comparator (COMPP1/COMPP2) and a back-gate-bias control circuit specific thereto. Specifically, the first memory section (SRAM 3c) has: a first array composed of memory cells (MC) with a select terminal connected with a word line (WL) and a data terminal connected with a bit line (BLB, VBP); and a first word-line-timing generator (WLTGEN1) operable to generate a first word-line timing signal (WLT1) for determining a word-line activation time for the first array. Further, the following are provided for the first memory section (SRAM 3c): a first comparator operable to make a comparison between the first word-line timing signal and a reference signal; and a first back-gate-bias control circuit which applies a back-gate bias for enlarging a read margin to the first array when a result of the comparison by the first comparator represents a low condition of the read margin, and which applies a back-gate bias for enlarging a write margin to the first array when the comparison result represents a low condition of the write margin. The second memory section (SRAM 3d) has: a second array composed of memory cells with a select terminal connected with a word line and a data terminal connected with a bit line; and a second word-line-timing generator operable to generate a second word-line timing signal for determining a word-line activation time for the second array. Further, the following are provided for the second memory section (SRAM 3d): a second comparator operable to make a comparison between the second word-line timing signal and a reference signal; and a second back-gate-bias control circuit which applies a back-gate bias for enlarging a read margin to the second array when a result of the comparison by the second comparator represents a low condition of the read margin, and which applies a back-gate bias for enlarging a write margin to the second array when the comparison result represents a low condition of the write margin.

[14] In the semiconductor device (1B) described in [13], the first and second arrays are different from each other in number of word lines. In other words, the first and second memory sections differ from each other in bit-line load, and in points where their word-line timing signals change. Therefore, it is significant to provide the first and second memory sections each having a comparator and a back-gate-bias control circuit from the viewpoint of increasing the accuracy of the back-gate-bias control.

[15] A semiconductor device according to an embodiment of the invention from another aspect thereof has: a first memory section; and a second memory section; a comparator provided so as to be linked to one memory section; and a back-gate-bias control circuit operable to control back-gate biases to the first and second memory sections based on a result of a comparison by the comparator. Specifically, the first memory section has: a first array composed of memory cells with a select terminal connected with a word line and a data terminal connected with a bit line; and a first word-line-timing generator operable to generate a first word-line timing signal for determining a word-line activation time for the first array. The second memory section has: a second array composed of memory cells with a select terminal connected with a word line and a data terminal connected with a bit line; and a second word-line-timing generator operable to generate a second word-line timing signal for determining a word-line activation time for the second array. The semiconductor device is provided with a comparator operable to make a comparison between the second word-line timing signal and a reference signal. Further, a back-gate-bias control circuit is adopted for the semiconductor device, which applies a back-gate bias for enlarging a read margin to the first and second arrays when a result of the comparison by the second comparator represents a low condition of the read margin, and which applies a back-gate bias for enlarging a write margin to the first and second arrays when the comparison result represents a low condition of the write margin.

[16] In the semiconductor device (1B) described in [15], the first and second arrays are identical to each other in number of word lines. Specifically, the first and second memory sections are identical to each other in bit-line load, and in points where their word-line timing signals change. Therefore, the circuit scale of the semiconductor device can be made smaller by arranging the semiconductor device so that the first and second memory sections share the comparator and back-gate-bias control circuit.

2. Further detailed description of the preferred embodiments

Now, the preferred embodiments will be described further in detail. The detailed descriptions concerning the embodiments carrying out the invention below will be presented with reference to the drawings. It is noted that as to all the drawings for explanation of the embodiment carrying out the invention, members or components having identical functions are identified by the same reference numeral or character, and the repeated description thereof is omitted here.

<<Compensation of an operating margin decline owing to the variation in word-line pulse width>>

FIG. 1 shows an example of a semiconductor device in association with the invention. The semiconductor device 1 shown in the drawing is formed as a so-called system LSI of SoC (System-on-a-Chip). Although not particularly restricted, the semiconductor device 1 is formed on one semiconductor substrate such as a bulk of monocrystalline silicon by e.g. a CMOS integrated circuit manufacturing technique.

The semiconductor device 1 has e.g. a CPU (Central Processing Unit) 2, which is shown representatively, an SRAM section 3 used as a work memory thereof, a back-gate-bias generator VBBGEN operable to generate back-gate-bias voltages VBN and VBP, and a comparator COMPP used to control the back-gate-bias generator VBBGEN.

Although not particularly restricted, the back-gate-bias generator VBBGEN controls the back-gate biases for the memory section 3. VBP denotes a back-gate-bias voltage applied to the substrate, especially n-type well region of a p-channel MOS transistor, hereinafter referred to as "pMOS transistor" simply. VBN denotes a back-gate-bias voltage applied to the substrate, especially p-type well region of a n-channel MOS transistor, hereinafter referred to as "nMOS transistor" simply. Voltage levels of the back-gate-bias voltages VBP and VBN are determined based on a signal CONTVB that the comparator COMPP outputs.

The SRAM section 3 has a memory cell array MCARY with SRAM cells laid out in a matrix form. As to the memory cell array MCARY, a select terminal of a memory cell is connected with a corresponding word line, and a data-I/O terminal thereof is connected with a pair of complementary bit lines. Although not particularly restricted, the complementary data lines are each coupled with a sense amplifier (SA). In the drawing, SAARY represents an array of the sense amplifiers. Of address signals ADRS for memory access, which CPU 2 has output, a row address signal is decoded by a row address decoder RADEC. On receipt of the resultant signal, a word-line driver WLDR drives a word line specified by the row address signal to a select level. Complementary data lines are arranged so that they can be connected with a common data line through a column-switch circuit CSW selectively. The common data line is connected with a main amplifier MAMP, and the main amplifier MAMP is connected with a data I/O buffer DIOBF. A column address signal in the address signals ADRS is decoded by a column address decoder CADEC. By using the signal thus decoded to control the switching of the column-switch circuit CSW, a pair of complementary bit lines specified by the column address signal is electrically connected with a common data line. In a read action, a pair of complementary bit lines is precharged to e.g. a source voltage by a precharge circuit (PRCRG) in advance. Then, when selecting a word line, a complementary level appears on a pair of complementary data lines according to stored information on memory cells, which is sensed and amplified by a sense amplifier (SA). The change of the complementary level is transmitted through the column-switch circuit CSW to the common data line, and amplified by a read amplifier in the main amplifier MAMP, and thus read data is output to the data bus DATA. In a write action, a write amplifier in the main amplifier MAMP drives the common data line and a pair of complementary bit lines selected by the column-switch circuit CSW to the complementary level according to write data supplied through the data bus DATA, and thus the data is written into a memory cell selected by a word line concerned. The internal timing controls of write and read actions are performed by a combination of a word-line-timing generator WLTGEN, and a timing controller TMGCNT which accepts an access control signal MCNT from CPU2, a clock signal CLK and others.

Figures 2, 3, 4:
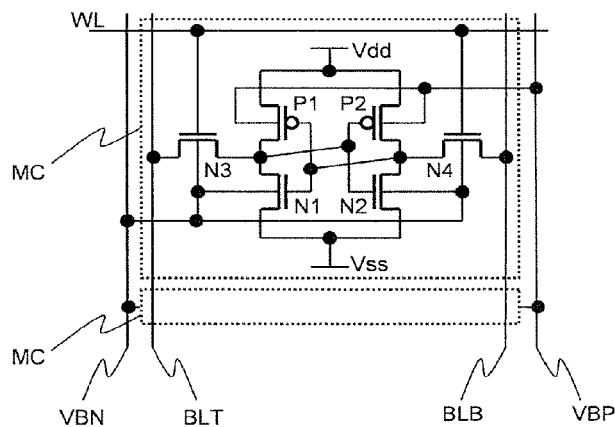

FIG. 2 shows an example of the circuit configuration of SRAM cells of the SRAM section 3. The memory cell MC has a static latch which includes an inverter with a pMOS transistor P1 and an nMOS transistor N1, and an inverter with a pMOS transistor P2 and an nMOS transistor N2; the input terminal of one inverter and the output terminal of the other are cross-coupled with each other. The output terminal of one CMOS inverter is connected with an nMOS transistor (select MOS transistor) N3, and the output terminal of the other CMOS inverter is connected with an nMOS transistor (select MOS transistor) N4. The gates of the select MOS transistors N3 and N4 are connected with a word line WL. Further, the select MOS transistor N3 is connected with a true bit line BLT, and the select MOS transistor N4 is connected with an inverted bit line BLB. A combination of a true bit line BLT and an inverted bit line BLB forms a pair of complementary bit lines. To the substrate of the nMOS transistor of the memory cell MC, a back-gate-bias voltage VBN is applied, while on the substrate of the pMOS transistor of the memory cell MC, a back-gate-bias voltage VBP is impressed. Now, it is noted that Vdd denotes a source voltage, and Vss denotes a ground voltage.

FIG. 3 shows examples of control of the MOS transistor threshold voltage Vth for enlargement of read and write margins of static type memory cells MC of SRAM, and a pattern of application of the back-gate biases necessary for that. The read margin of memory cells MC means a measure of the difficulty in causing inversion of stored information in the course of a read action, i.e. a degree of stored information never being easily inverted in a read action. The write margin means a certainty of inverted writing in the course of a write action, i.e. a degree of the ease of inverting stored information in a write action.

For improvement of the read margin, it is adequate to raise a voltage (trip point) at which an output of an inverter included in the memory cell MC is inverted. Therefore, the goal can be achieved by increasing the threshold voltage (Vth) of the nMOS transistor (i.e. making higher the absolute value thereof), and in parallel, decreasing the threshold voltage of the pMOS transistor (i.e. making lower the absolute value thereof). Specifically, in case that the threshold voltage of an nMOS transistor N1 (or N2) which draws a precharged electricity of a bit line BLT (or BLB) is low in absolute value, a large current flows through the nMOS transistor N1 (or N2) causing its drain voltage to float. In case that the threshold voltage of a pMOS transistor P2 (or P1) on the opposite side thereof is low in absolute value, the voltage of the bit line BLB (or BLT) on the opposite side is lowered undesirably.

In contrast, for improvement of the write margin, it is adequate to decrease currents of the pMOS transistors P1 and P2 for load, which supply currents, and increase currents of the nMOS transistors N3 and N4 for transfer. These requirements can be met by making lower the absolute value of the threshold voltage of the nMOS transistor, and in parallel, making higher the absolute value of the threshold voltage of the pMOS transistor. FIG. 3 shows examples of back-gate-bias voltages adequate for this purpose. Under the condition that the source voltage Vdd=1.2 volts, and the ground voltage Vss=0 volt, the back-gate-bias voltage VBN applied to the substrate of the nMOS transistors is made a negative voltage of −1.2 volts in the case of applying a reverse bias (i.e. making higher the threshold voltage in absolute value), whereas in the case of applying a forward bias (i.e. making lower the threshold voltage in absolute value), a positive voltage of 0.6 volts is applied. In other cases, the ground voltage Vss is applied to the substrate. The back-gate-bias voltage VBP applied to the substrate of the pMOS transistors is made 2.4 volts higher than the source voltage Vdd in the case of applying a reverse bias, whereas in the case of applying a forward bias, a voltage of 0.6 volts lower than the source voltage Vdd is applied.

FIG. 4 shows examples of the relation between a word-line activation time (word-line pulse width) depending on a select signal on a word line WL and SRAM operating margin. In a case that the word-line pulse width is shorter, the read margin is increased. This is because when the time during which a word line remains ON is made shorter, the time during which a current capable of destroying data stored in an SRAM memory cell continues flowing is shortened, and thus data in the memory cell becomes harder to destroy. In contrast, the write margin is reduced in the case that the word-line pulse width is shorter. This is because when the time during which a word line remains ON is shorter, the time during which a memory cell current necessary for writing a new datum continues flowing is shortened, and therewithal it becomes harder to write to the memory cell, resulting in a reduction in the write margin. Further, when the word-line pulse width is longer, the read margin is made smaller and the write margin is made larger for a reason contrary to that in the case that the word-line pulse width is smaller.

It is understood from FIGS. 3 and 4 that the write margin is made smaller in the case that the word-line pulse width is shorter, and therefore applying a forward bias to the nMOS transistors, and a reverse bias to the pMOS transistors as shown by the write margin's column of the table of FIG. 3 can compensate the reduced write margin. It is also understood that the read margin is made smaller in the case that the word-line pulse width is longer, and therefore applying a reverse bias to the nMOS transistors and a forward bias to the pMOS transistors as shown by the read margin's column of the table of FIG. 3 can compensate the reduced read margin.

In consideration of the above, the SRAM section 3 autonomously controls its own back-gate-bias voltage according to the word-line pulse width in this embodiment. A structure to do so will be described below.

Figure 5:
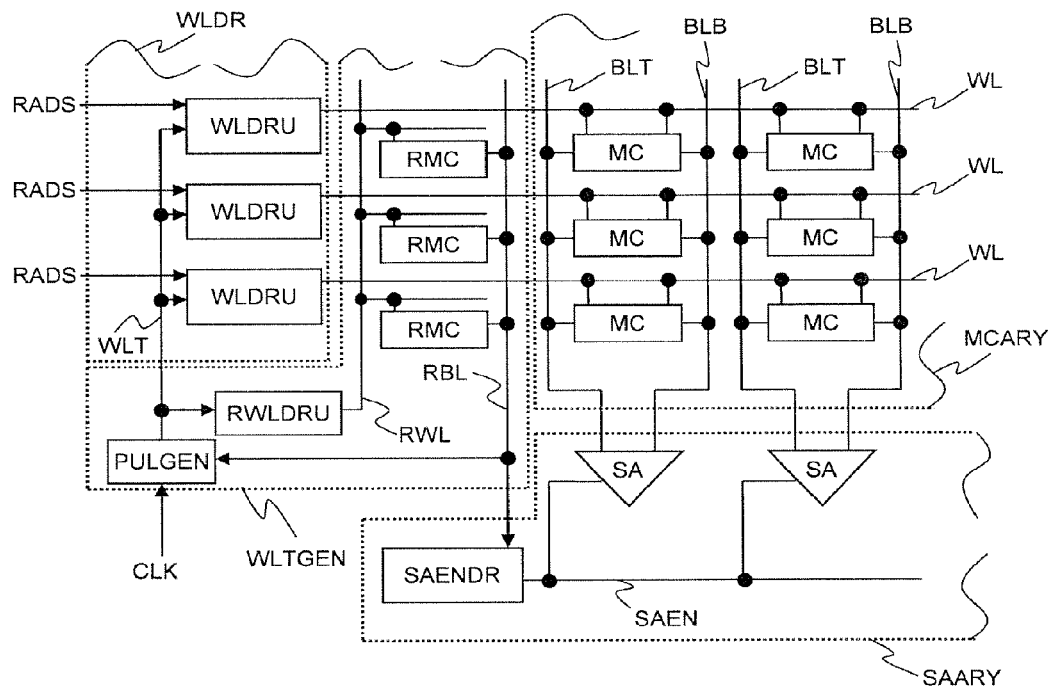
FIG. 5 is a circuit diagram showing an example of the structure of a word-line-timing generator.

FIG. 5 shows an example of the structure of the word-line-timing generator WLTGEN. The word-line driver WLDR has a driver unit WLDRU for each word line WL. When each driver unit WLDRU accepts a row-address-decode signal RADS output by the row address decoder RADEC, and a word-line timing signal WLT, the word-line driver selects and drives the corresponding word line. To each word line WL, a select terminal of CMOS SRAM cell MC is connected. To a pair of complementary bit lines BLT and BLB is connected a pair of data I/O terminals of a memory cell MC. Turning to, as part of the word-line-timing generator WLTGEN, a replica circuit equivalent to a structure consisting of a pair of complementary bit lines and a line of memory cells MC forming one column, the replica circuit has: a replica driver unit RWL-DRU identical in circuit characteristic to the driver unit WLDRU; a replica word line RWL equivalent to a word line; a plurality of replica cells RMCs connected in common to the replica word line RWL one after another; and a replica bit line RBL connected with the replica cells RMCs in turn and having a load equivalent to the bit-line load. The replica bit line RBL is connected with a sense-amplifier-energizing driver SAENDR and a word-line-pulse generator PULGEN. The sense-amplifier-energizing driver SAENDR generates an enable signal SAEN for sense amplifiers SA. The word-line-pulse generator PULGEN generates a word-line timing signal WLT.

Figure 6:
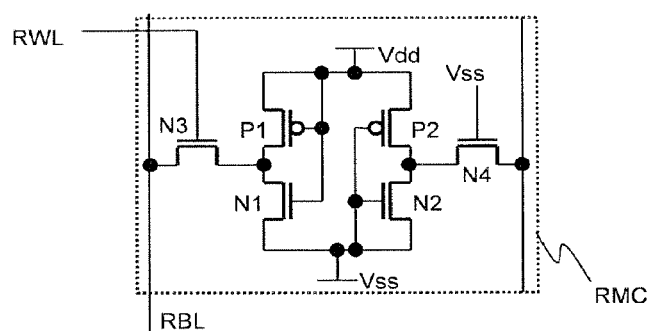
FIG. 6 is a circuit diagram showing an example of the circuit configuration of a replica cell.

FIG. 6 shows an example of the circuit configuration of the replica cell RMC. Specifically, the replica cells RMC each have MOS transistors P1, P2, and N1 to N4, like the memory cells MC. An input of an inverter composed of the MOS transistors P1 and N1 is connected with the source voltage Vdd, and an input of an inverter composed of the MOS transistors P2 and N2 is connected with the ground voltage Vss. The gate of the nMOS transistor N3 is connected with the replica word line RWL, and the source of the nMOS transistor N3 is connected with the replica bit line RBL. When the replica word line RWL is selected, an action to discharge the replica bit line RBL which has been precharged to the source voltage Vdd is performed on the replica cell RMC. This action is equivalent to the one of discharging the true bit line BLT by the word line selection, which has been precharged to the source voltage Vdd, and making the true bit line settled at Low level.

Although not particularly restricted, at the time of accessing a memory, the word-line-pulse generator PULGEN of FIG. 5 energizes the word-line timing signal WLT, e.g. brings the word-line timing signal WLT to High level, in synchronization with the cycle of the clock signal CLK, and deactivates the word-line timing signal WLT, e.g. brings the word-line timing signal to Low level, in synchronization with discharge of the replica bit line RBL. In a read action, the sense-amplifier-energizing driver SAENDR energizes an enable signal SAEN to the sense amplifier SA in synchronization with discharge of the replica bit line RBL, and then starts the sense amplifier SA sensing and amplifying signals.

Figure 7:
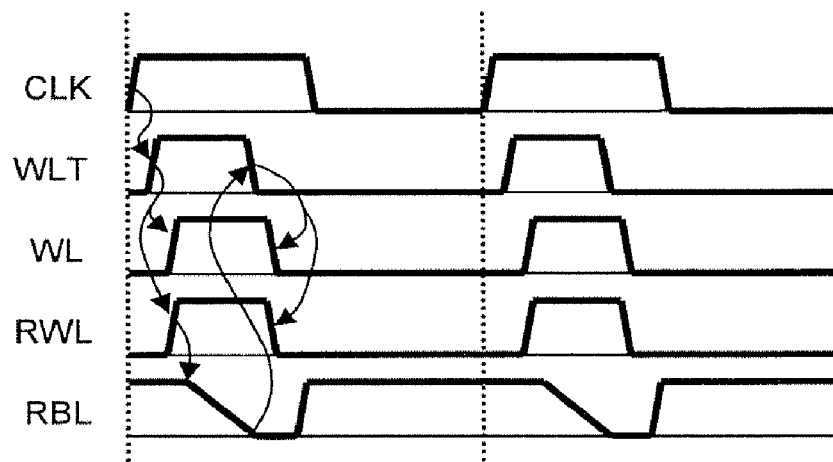
FIG. 7 is a timing chart for explaining an operation of the word-line-timing generator.

FIG. 7 shows an example of the operation timing chart of the word-line-timing generator WLTGEN. The word-line timing signal WLT is activated in synchronization with a change at a leading edge of a clock signal CLK, thereby driving a word line WL to the select level, and concurrently urging the replica word line RWL to the select level. When the replica word line RWL is selected, discharge of a precharged electricity on the replica bit line RBL through the nMOS transistor N1 of the replica cell RMC is started. After the level of the replica bit line RBL is made to settle at Low level, the word-line timing signal WLT is deactivated, whereby the word line WL and replica word line RWL are inverted to a non-select level. As clear from the drawing, the word-line activation time (word-line pulse width) depends on a duration during which the word-line timing signal WLT stays at High level.

Figure 8:
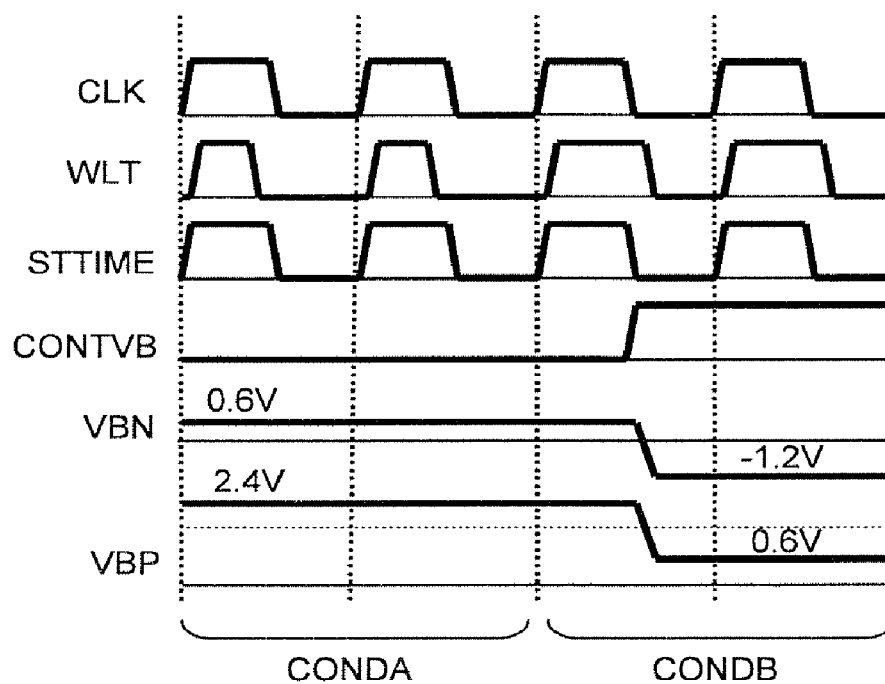
FIG. 8 is a timing chart for explaining an operation for threshold voltage control according to word-line pulse width.

Referring now to FIG. 8, an example of the operation timing of threshold voltage control according to the word-line pulse width will be shown. The comparator COMPP which generates a signal CONTVB for controlling the back-gate-bias voltages VBP and VBN in voltage level described with reference to FIG. 1 accepts input of a word-line timing signal WLT, and then makes comparison between the pulse width of a reference signal STTIME and the word-line pulse width, which represents a period of the word-line timing signal staying at High level. The comparator COMPP is composed of e.g. a flip-flop such as a D-type latch, which latches the word-line timing signal WLT at times of the falling edge of the reference signal STTIME. In a case that the word-line pulse width is smaller than the reference signal STTIME, the comparator COMPP outputs a signal CONTVB of Low level. Otherwise, the comparator outputs a signal CONTVB of High level. On receipt of the signal CONTVB, the back-gate-bias control circuit VBBGEN works as follows: in the case of the signal CONTVB being at Low level (with the word-line pulse width shorter than the reference signal STTIME and the write margin smaller than the read margin), which corresponds to the condition CONGA of FIG. 8, the back-gate-bias control circuit applies back-gate-bias voltages of e.g. VBN=0.6 volts and VBP=2.4 volts so as to enlarge the write margin; in contrast, in the case of the signal CONTVB being at High level (with the word-line pulse width longer than the reference signal STTIME, and the read margin smaller than the write margin), which corresponds to the condition CONDB of FIG. 8, the back-gate-bias control circuit applies back-gate-bias voltages of e.g. VBN=−1.2 volts and VBP=0.6 volts so as to enlarge the read margin. It is noted that a circuit with a flip-flop is described here as the simplest example of circuits operable to make a comparison in timing, however a circuit operable to make a comparison in signal timing, such as a phase comparator, may be used instead. The reference signal STTIME is an external signal supplied from the outside of the semiconductor device 1. The reference signal STTIME per se is never directly affected by the process variation of the semiconductor device 1. It is also possible to adopt the clock CLK as the reference signal instead of the signal STTIME.

As to the autonomous back-gate-bias control based on the word-line pulse with, the case of using, as back-gate biases for the nMOS and pMOS transistors, both forward and reverse biases as shown in FIG. 3 has been described. However, all the biases need not to be used. Examples of application of other back-gate biases are shown in FIG. 9. The pattern #1 is a back-gate-bias control pattern based on the pattern shown in FIG. 3. The pattern #2 is an example where only reverse biases are applied. In this example, leakage current can be reduced to a lower level because no forward bias is applied. The pattern #3 shows an example where only forward biases are applied. Both the forward bias voltages of back-gate-bias voltages VBN and VBP take values between the source voltage Vdd and ground voltage Vss, and therefore the back-gate-bias voltages can be generated relatively with ease, which enables the circuit scale of the back-gate-bias generator VBBGE to be kept down. The pattern #4 shows an example where back-gate biases are applied to only the nMOS transistors. In the example, it is enough to control only a P well. Therefore, as to an LSI having a triple-well structure easy to separate a P well, it becomes possible to control the back-gate biases in very small units, e.g. in SRAM sections. The pattern #5 shows an example where back-gate biases are applied to only the pMOS transistors. In the example, it is enough to control only an N well. Therefore, with an LSI having a double-well structure easy to separate an N well, it becomes possible to control the back-gate biases in very small units, e.g. in SRAM sections. The pattern #6 shows an example where a reverse bias is applied to only the nMOS transistors. The LSI takes a structure having both of advantages that the patterns #2 and #4 offer. However, because only a reverse bias for the nMOS transistors is used, the effect achieved by increasing the operating margin is smaller in comparison to the patterns #1-#5. The pattern #7 shows an example where a reverse bias is applied to only the pMOS transistors. The LSI takes a structure having both of advantages that the patterns #2 and #5 achieve. However, because only a reverse bias for the pMOS transistors is used, the effect attained by increasing the operating margin is smaller in comparison to the patterns #1-#5. The pattern #8 shows an example where a forward bias is applied to only the nMOS transistors. In the example, the LSI takes a structure having both of advantages that the patterns #3 and #4 attain. However, because only a forward bias for the nMOS transistors is used, the effect achieved by increasing the operation margin is smaller in comparison to the patterns #1-#5. The pattern #9 shows an example where a forward bias is applied to only the pMOS transistors. In the example, the LSI takes a structure having both of advantages that the patterns #3 and #5 achieve. However, because only a reverse bias for the nMOS transistors is used, the effect achieved by increasing the operating margin is smaller in comparison to the patterns #1-#5.

As described above, changing the back-gate biases according to the word-line pulse width enables the improvement of the operating margin. While the variations in threshold voltages Vth of transistors increase with the progress of scale-down of manufacturing processes, raising the threshold voltage in absolute value thereby to compensate the operating margin in order to cope with this can help to lower the voltage of an SRAM section.

Figure 10:
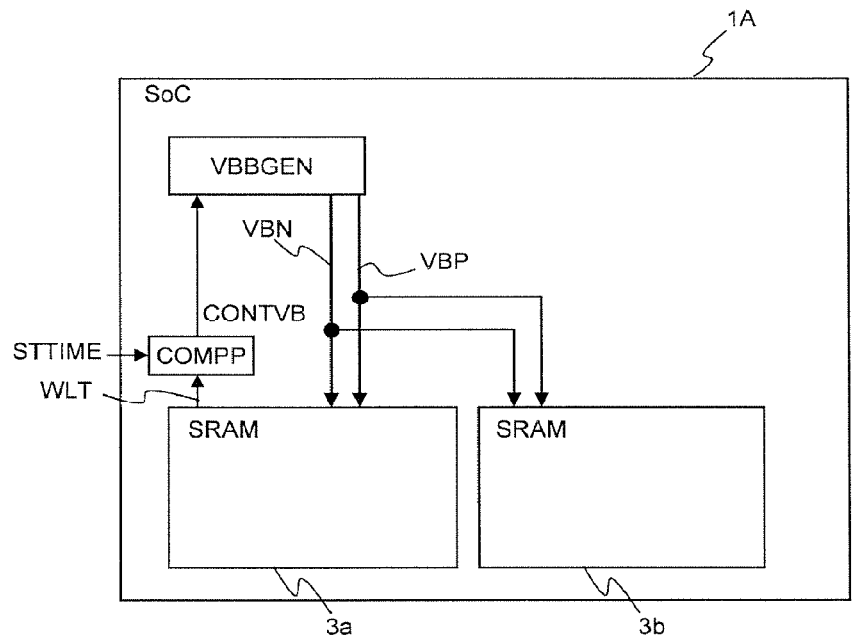
FIG. 10 is a block diagram showing an example of a semiconductor device arranged to be operable to exercise the back-gate-bias control on more than one SRAM section in common.

FIG. 10 shows an example of a semiconductor device 1A of SoC type arranged to be operable to exercise the back-gate-bias control on more than one SRAM section in common. A semiconductor device of SoC type like this has lots of circuit modules, and accordingly it contains many SRAM sections. As shown in FIG. 10, the semiconductor device 1A includes two SRAM sections 3a and 3b. A word-line timing signal WLT output by one SRAM section is received by the comparator COMPP. Then, the comparator COMPP generates a signal CONTVB. The back-gate-bias generator VBBGEN accepts the signal CONTVB, and then generates back-gate-bias voltages VBN and VBP used in common to the two SRAM sections 3a and 3b. The SRAM sections 3a and 3b subjected to common back-gate-bias control in parallel are identical to each other in the bit-line load on their memory arrays. The semiconductor device 1A can also achieve effects and advantages comparable to those as already described above. The number of SRAM sections included in the semiconductor device 1A may be three or more.

Figure 11:
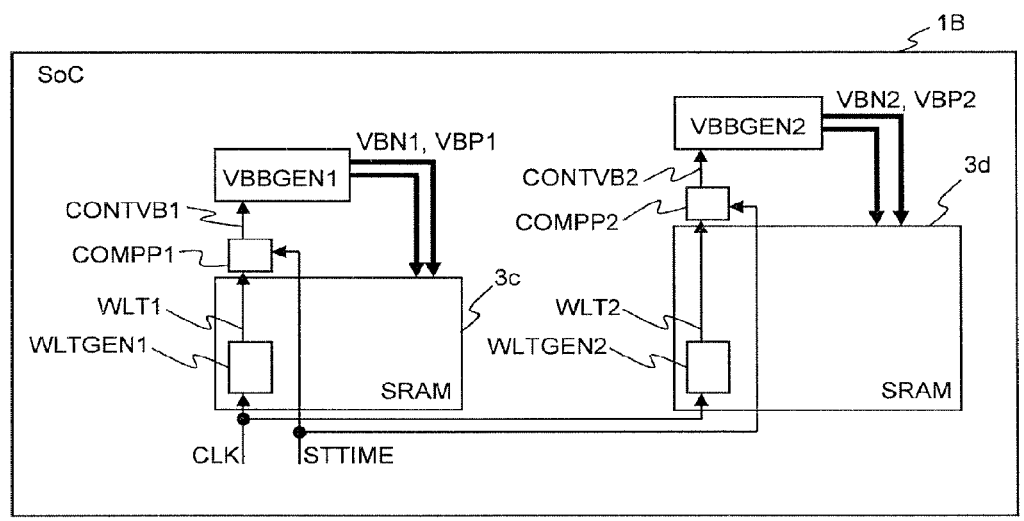
FIG. 11 is a block diagram of a semiconductor device arranged to individually exercise the back-gate-bias control on more than one SRAM section.

FIG. 11 shows an example of a semiconductor device 1B of SoC type arranged to be operable to exercise the back-gate-bias control on more than one SRAM section individually. As shown in FIG. 11, the semiconductor device 1B has two SRAM sections 3c and 3d. A word-line timing signal WLT1 output by a word-line-timing generator WLTGEN1 of one SRAM section 3c is received by the comparator COMPP1. Then, the comparator COMPP1 generates a signal CONTVB1. The back-gate-bias generator VBBGEN1 accepts the signal CONTVB1, generates back-gate-bias voltages VBN1 and VBP1, and directs them toward the SRAM section 3c. A word-line timing signal WLT2 output by a word-line-timing generator WLTGEN2 of the other SRAM section 3d is received by the comparator COMPP2. Then, the comparator COMPP2 generates a signal CONTVB2. The back-gate-bias generator VBBGEN2 accepts the signal CONTVB2, generates back-gate-bias voltages VBN2 and VBP2, and directs them toward the SRAM section 3d. The word-line-timing generators WLTGEN1 and WLTGEN2, the comparators COMPP1 and COMPP2, and the back-gate-bias generators VBBGEN1 and VBBGEN2 are arranged similarly to the corresponding modules of FIG. 1. The SRAM sections 3c and 3d are different from each other in the bit-line load on the memory arrays, and accordingly the word-line-timing generators WLTGEN1 and WLTGEN2 differ from each other. Hence, the SRAM sections 3c and 3d vary in circuit configuration for back-gate-bias control.

Figures 12, 13:
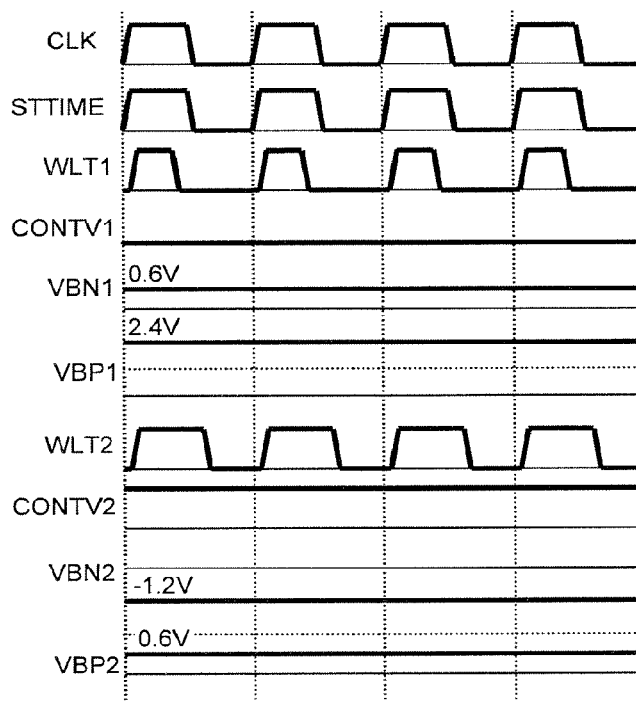
FIG. 12 is a timing chart for explaining an action of back-gate-bias control in the semiconductor device of FIG. 11.
FIG. 13 is a table showing examples of control patterns in a case that back-gate-bias voltages are changed according to a bit-line load.

FIG. 12 shows an example of the operation timing of back-gate-bias control in the semiconductor device 1B shown in FIG. 11. To actuate the SRAM sections 3c and 3d, a clock CLK and a reference signal STTIME serving as a measure of the word-line pulse width are input to the SRAM sections 3c and 3d. The clock CLK and reference signal STTIME are generated in e.g. a module for timing control in the semiconductor device 1B. As the SRAM section 3c has a memory array with a small storage capacity (a small bit-line load), the word-line pulse width of a word-line timing signal WLT1 generated by e.g. the replica circuit of the word-line-timing generator WLTGEN described with reference to FIGS. 1 and 5 becomes shorter. Hence, when comparing the signal WLT1 showing the word-line timing with the entered timing-reference signal STTIME, the word-line timing signal WLT1 is shorter, and therefore the signal CONTVB1 is made Low level, and the back-gate-bias generator VBBGEN1 outputs back-gate-bias voltages VBN1 and VBP1 most suitable for the SRAM section 3c. In this case, the word-line pulse width depending on the word-line timing signal WLT1 is made shorter, and therefore the SRAM section 3c is regarded as having a small write margin and a large read margin. Thus, a forward bias is applied to the nMOS transistors as the back-gate-bias voltage VBN1, and a reverse bias is applied to the pMOS transistors as the back-gate-bias voltage VBP1. As the SRAM section 3d has a memory array with a large storage capacity (a large bit-line load), the word-line pulse width achieved by the word-line timing signal WLT2 becomes longer in a case where a word-line timing is created by e.g. the replica circuit of the timing generator WLTGEN2. Hence, the word-line timing signal WLT2 is longer than the reference signal STTIME, and the comparator COMPP2 outputs a signal CONTVB2 of High level. Then, the back-gate-bias generator VBBGEN2 outputs back-gate-bias voltages VBN2 and VBP2 most suitable for the SRAM section 3d. In this case, the word-line pulse width depending on the word-line timing signal WLT2 is made longer, and therefore the SRAM section 3d is regarded as having a small write margin and a large read margin. Thus, a reverse bias is applied to the nMOS transistors as the back-gate-bias voltage VBN2, and a forward bias is applied to the pMOS transistors as the back-gate-bias voltage VBP2.

In the present circumstances, general SoC devices contain various sizes of SRAMs different in storage capacity, bit-line load, and others, and their word-line pulse widths vary depending on the configurations thereof. Therefore, even SRAM sections working on a common chip and under the same condition are different in operating margin condition, and the back-gate biases most suitable for the individual SRAM section configurations are also different. Using the semiconductor device configured as shown in FIG. 11, the following are made possible: to apply back-gate biases most suitable for individual SRAM configurations; and to autonomously set operation margins, which fluctuate according to the word-line timing varying depending on the SRAM configurations, to be most suitable for individual SRAM configurations. As to the word-line pulse width, the replica circuit sets a time which allows data to be read from a memory cell in general. As such time which enables data to be read fluctuates depending on a load capacity on a bit line, the time depends on the number of memory cells coupled with each bit line, i.e. the number of rows of a memory array. Accordingly, the smaller the number of rows of a memory array is, the shorter the word-line pulse width is. Conversely, the larger the number of rows, the longer the word-line pulse width is. Therefore, the invention can be embodied from the aspect that the back-gate biases are set according to the number of rows of a memory array, i.e. the number of rows of memory cells in a word-line direction. FIG. 13 shows examples of the number of memory cell rows and the settings of the back-gate-bias voltages depending on the rows' numbers, which are embodied from the aspect. The specific values also vary depending on the detail of the design of SRAM sections. FIG. 13 shows examples where forward and reverse biases are applied to the nMOS and pMOS transistors as the back-gate-bias voltages. However, as shown in FIG. 9, it is possible to adopt control patters including e.g. a pattern where only nMOS or pMOS transistors are subjected to application of a back-gate-bias voltage, and a pattern where only a forward or reverse bias is applied.

While not particularly shown in the drawing, it is possible to exercise the back-gate-bias control under a condition where both the configurations shown in FIGS. 10 and 11 are adopted. Specifically, it is possible that grouped SRAM sections in a SoC share a circuit operable to measure the word-line pulse width for generation of a back-gate bias and the back-gate biases are controlled in the same way.

Figure 14:
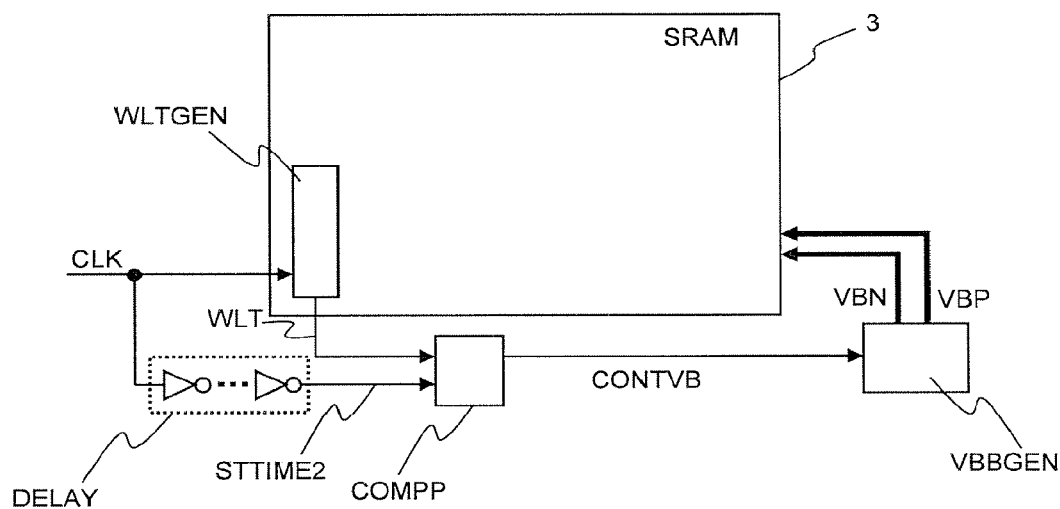
FIG. 14 is a block diagram of a semiconductor device taking another control form arranged so that a reference signal generated by delaying a clock signal is used to exercise the back-gate-bias control.

FIG. 14 shows a semiconductor device taking another control form for back-gate-bias control in association with an SRAM section. The form of FIG. 14 differs from that of FIG. 1 in the reference signal. DELAY denotes a delay circuit operable to delay a clock signal CLK. STTIME2 denotes a reference signal generated by delaying the clock signal. The comparator COMPP makes a comparison between the reference signal STTIME2 and word-line timing signal WLT to generate a signal CONTVB in the same way as that adopted by the device of FIG. 1.

Figure 15:
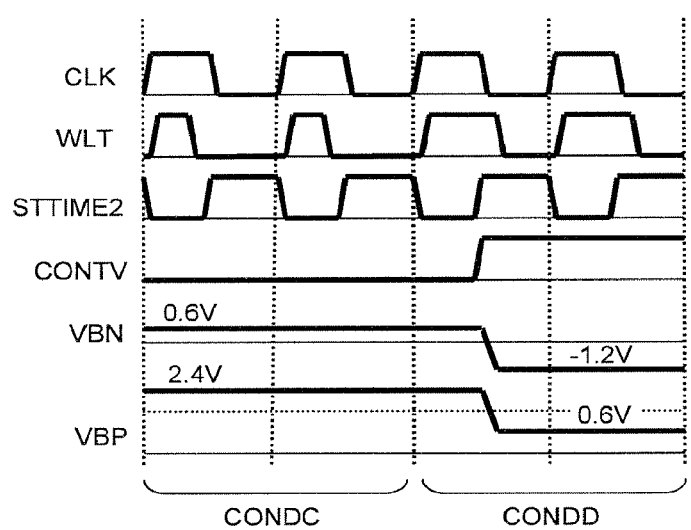
FIG. 15 is a timing chart for explaining an action of back-gate-bias control in the semiconductor device of FIG. 14.

Referring now to FIG. 15, an example of the operation timing of back-gate-bias control by the device of FIG. 14 will be shown. Concurrently with input of the clock signal CLK, the signal WLT showing the word-line timing is made High level. Thereafter, at a time when the circuit WLTGEN operable to produce a word-line timing generates a timing for deactivating a word line, whereby the word line is deactivated, the signal WLT is made Low level. The step of generating this level of signal WLT is the same as that of the device of FIG. 1. At the same time, the delay circuit DELAY is used to delay the clock signal CLK by a certain length of time, whereby a reference signal STTIME2 is generated. In the condition CONDC of FIG. 15, the signal WLT is deactivated into Low level earlier than a time at which the reference signal STTIME2 is made High level. In this case, the word-line pulse width is made shorter than that of the reference signal, and an output from the comparator COMPP is made Low level. Further, in this case, the write margin remains reduced because of the word-line pulse width shorter than that of the reference signal, and therefore, the back-gate-bias generator VBBGEN generates, as back-gate biases for increasing the write margin, back-gate-bias voltages VBN and VBP, which form a forward bias to nMOS transistors and a reverse bias to pMOS transistors, and the back-gate biases thus generated are applied to the SRAM section 3. In the condition CONDD of FIG. 15, the signal WLT is deactivated after a time when the signal STTIME2 is made High level. In this case, the word-line pulse width is longer than that of the reference signal, and an output CONTVB from the comparator COMPP is made High level. Further, in this case, the read margin remains reduced because of the word-line pulse width longer than that of the reference signal, and therefore, the back-gate-bias generator VBBGEN generates, as back-gate biases for increasing the read margin, back-gate-bias voltages VBN and VBP, which form a reverse bias to nMOS transistors and a forward bias to pMOS transistors, and the back-gate biases thus generated are applied to the SRAM section 3. The semiconductor device configured as shown in FIG. 14 can achieve the same effects and advantages as those attained by the semiconductor device described above.

As the two conditions are represented by the same waveform in FIG. 15, a case where the timing is changed in one module seems to be assumed. However, the invention is not necessarily limited so. Also, in a case that different word-line timings are detected in more than one SRAM section as in the device of FIG. 11, it is possible to use the same circuit. Further, in this case, the delay circuit is used to generate a reference signal for measuring the word-line pulse width in the SRAM section instead of supplying the reference signal from the outside. However, use of the delay circuit is not essential in fact, and the same function can be materialized by another circuit operable to generate a timing.

<<Compensation of an operating margin decline owing to the variation in nMOS transistor threshold voltage Vth>>

Compensation of an operation margin fluctuating according to the word-line activation time (word-line pulse width) has been described in the description above, and therefore compensation of an operating margin fluctuating according to the process fluctuation (e.g. the variation in threshold voltage of a MOS transistor) will be described below. Taken as an example here is a case where the word-line pulse width of a word-line timing signal WLT is used to detect a the variation in threshold voltage of a MOS transistor owing to process fluctuation. As described above, the word-line pulse width depends on the speed of discharge through the nMOS transistors N1 and N3 of the replica cell RMC, which has been described with reference to FIG. 6. Therefore, attention is focused on the variation in threshold voltage of an nMOS transistor particularly. The circuit configuration of a semiconductor device of this case differs from the above-described circuit configurations in association with the semiconductor device shown in FIG. 1 in the control logic of the back-gate-bias generator VBBGEN which generates back-gate-bias voltages VBN and VBP based on a signal CONTVB, however they may be identical in the rest. Hence, it is omitted to singly show a schematic representation of the semiconductor device configuration viewed from such standpoint. The reference signal denoted by STTIME varies between the case of compensating an operation margin fluctuating according to the word-line activation time (word-line pulse width) from the first standpoint, and the case of compensating an operating margin fluctuating according to the process fluctuation (e.g. the variation in threshold voltage of a nMOS transistor) from the second standpoint.

FIG. 16 shows fluctuation patterns of operating margins of SRAM when the threshold voltage Vth of an nMOS transistor fluctuates. In a case that the threshold voltage Vth of an nMOS transistor is large in absolute value (i.e. the threshold voltage Vth is high), data held by SRAM is made harder to destroy, and therefore the read margin is made larger and the write margin is made smaller. In contrast, in a case that the threshold voltage Vth of the nMOS transistor is small in absolute value (i.e. the threshold voltage Vth is low), data held by SRAM is made easier to destroy, and therefore the read margin is made smaller and the write margin is made larger.

Figure 18:
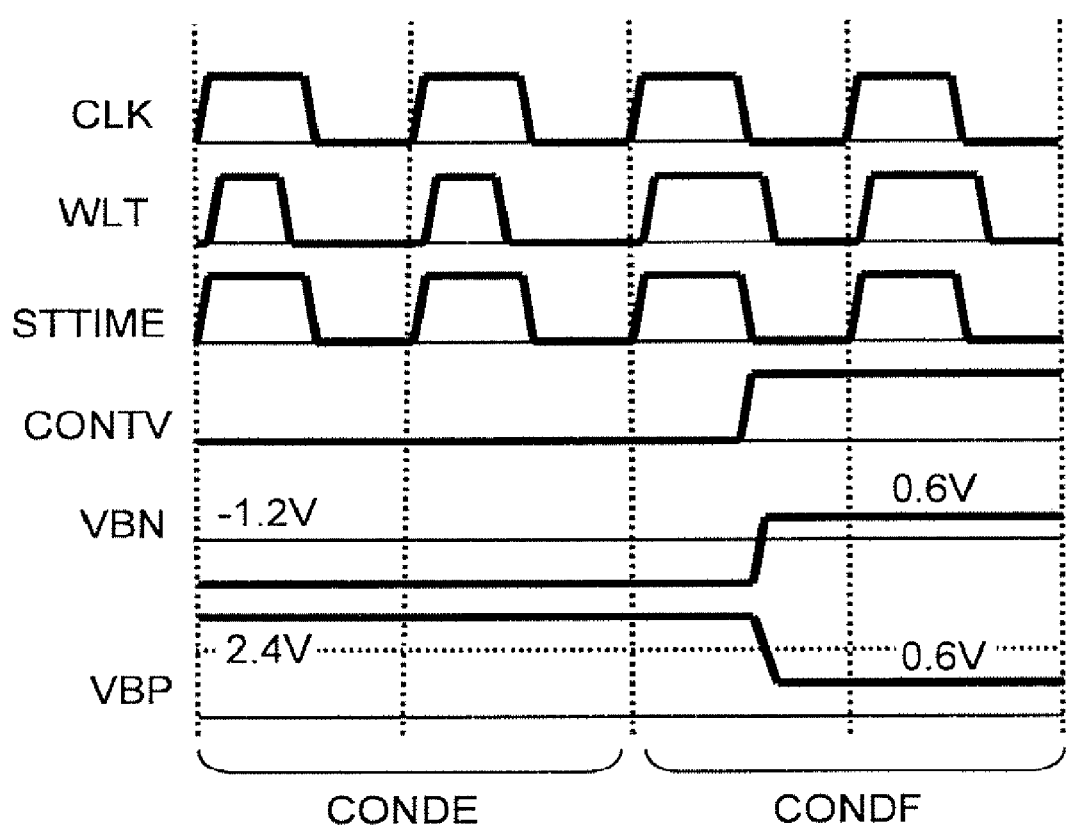
FIG. 18 is a timing chart for explaining an action of back-gate-bias control based on the assumption that the fluctuation in the threshold voltage Vth of an nMOS transistor causes the fluctuation of an operation margin of SRAM.

As described above with reference to FIGS. 5 and 6, a replica circuit very sensitive to a current of an nMOS transistor is used for a part which generate a word-line timing. Therefore, in a case that a current of an nMOS transistor is large, i.e. the threshold voltage Vth of the nMOS transistor is low, the on-resistance of the nMOS transistor becomes smaller, and the word-line pulse width is made shorter. In a case that a current of an nMOS transistor is small, i.e. the threshold voltage Vth of the nMOS transistor is high, the word-line pulse width becomes longer. Therefore, it can be made possible to compensate an operation margin of an SRAM section having fluctuated owing to the process fluctuation by: controlling the back-gate biases so as to increase the read margin (namely to apply a reverse bias to the nMOS transistors and a forward bias to the pMOS transistors) and to reduce the write margin (namely, to apply a forward bias to the nMOS transistors and a reverse bias to the pMOS transistors) when the word-line pulse width is shorter; and in contrast when the word-line pulse width is longer, controlling the back-gate biases so as to reduce the read margin and to increase the write margin. This control is exemplified in the pattern #1 of FIG. 17. An example of the operation timing of the back-gate-bias control based on this pattern is exemplified by FIG. 18.

Like FIG. 9, FIG. 17 shows not only the pattern #1 by which forward and reverse biases are applied to the nMOS and pMOS transistors as their back-gate-bias voltages, but also examples of various control patterns including a pattern arranged so that only the nMOS transistors undergo application of a back-gate-bias voltage, a pattern arranged so that only the pMOS transistors undergo application of a back-gate-bias voltage, a pattern arranged so that only a forward bias is applied, and a pattern arranged so that only a reverse bias is applied.

As will be clear from a comparison between FIGS. 17 and 9, the patterns of applying the back-gate-bias voltages corresponding to the word-line pulse width, which is a means for compensating a variation, are arranged to be opposite to each other. This is not a contradiction, but a necessary result from the difference between points which attention is focused on. Whether to adopt the former standpoint or latter one depends on what design concept is taken into account. For instance, the latter standpoint is adopted in a case that a device is designed with an ample flexibility to cope with the variation in word-line pulse width, whereas the former is taken in a case that a device is designed with an insufficient flexibility to handle the variation in word-line pulse width.

In terms of compensation of the variation in threshold voltage of a MOS transistor, to improve an operating margin of an SRAM section is made possible by changing back-gate biases of more than one SRAM section included in a semiconductor device according to the word-line pulse width. Further, it can contribute to the reduction of the power consumption by SRAM sections to increase the threshold voltage in absolute value thereby to compensate an operating margin in order to cope with the variations in threshold voltages Vth of transistors increasing in number and expanding in scale with the progress of scale-down of the manufacturing process.

While the invention made by the inventor has been specifically described above based on the embodiments thereof, it is not limited to the embodiments. It will be obvious that various changes and modifications may be made without departing from the scope of the invention.

For instance, the configuration of a circuit operable to generate a word-line timing signal is not limited to the above-described circuit, and the circuit configuration may be changed appropriately. A semiconductor device according to the invention is not limited to SoC equipped with CPU. The invention is applicable to a memory LSI composed of a discrete SRAM, and various semiconductor devices, such as a device including CPU and e.g. another logic, and a device including CPU and a circuit module other than CPU. The target for the back-gate-bias control may be limited to a memory cell array, expanded to a range including a memory cell array and its peripheral area, or further expanded to an entire memory. When exercising the control taking into account the variation in threshold voltage of a MOS transistor, the target range of the back-gate-bias control may be expanded to a circuit which has an influence on the operation timing of a memory.

What is claimed is:

1. A semiconductor device, comprising:
    a first array composed of memory cells with a select terminal connected with a word line and a data terminal connected with a bit line;
    a first word-line-timing generator operable to generate a first word-line timing signal for determining a word-line activation time for the first array;
    a first comparator operable to make a comparison between the first word-line timing signal and a reference signal;
    a first back-gate-bias control circuit which applies a back-gate bias for enlarging a read margin to the first array when a result of the comparison by the first comparator represents a low condition of the read margin, and which applies a back-gate bias for enlarging a write margin to the first array when the comparison result represents a low condition of the write margin;
    a second array composed of memory cells with a select terminal connected with a word line and a data terminal connected with a bit line;
    a second word-line-timing generator operable to generate a second word-line timing signal for determining a word-line activation time for the second array;
    a second comparator operable to make a comparison between the second word-line timing signal and a reference signal; and
    a second back-gate-bias control circuit which applies a back-gate bias for enlarging a read margin to the second array when a result of the comparison by the second comparator represents a low condition of the read margin, and which applies a back-gate bias for enlarging a write margin to the second array when the comparison result represents a low condition of the write margin.

2. The semiconductor device according to claim 1, wherein the first and second arrays are different from each other in number of word lines.

3. A semiconductor device, comprising:
    a first array composed of memory cells with a select terminal connected with a word line and a data terminal connected with a bit line;
    a first word-line-timing generator operable to generate a first word-line timing signal for determining a word-line activation time for the first array;
    a second array composed of memory cells with a select terminal connected with a word line and a data terminal connected with a bit line;
    a second word-line-timing generator operable to generate a second word-line timing signal for determining a word-line activation time for the second array;
    a comparator operable to make a comparison between the second word-line timing signal and a reference signal; and
    a back-gate-bias control circuit which applies a back-gate bias for enlarging a read margin to the first and second arrays when a result of the comparison by the second comparator represents a low condition of the read margin, and which applies a back-gate bias for enlarging a write margin to the first and second arrays when the comparison result represents a low condition of the write margin.

4. The semiconductor device according to claim 3, wherein the first and second arrays are identical to each other in number of word lines.

* * * * *